(12) United States Patent
Hara (10) Patent No.: US 6,269,030 B1
(45) Date of Patent: Jul. 31, 2001

(54) SEMICONDUCTOR MEMORY DEVICE

(75) Inventor: Takahiko Hara, Yokohama (JP)

(73) Assignee: Kabushiki Kaisha Toshiba, Kanagawa-ken (JP)

( * ) Notice: Subject to any disclaimer, the term of this patent is extended or adjusted under 35 U.S.C. 154(b) by 0 days.

(21) Appl. No.: 09/625,640

(22) Filed: Jul. 25, 2000

(30) Foreign Application Priority Data

Jul. 26, 1999 (JP) .................................................. 11-210295

(51) Int. Cl.$^7$ ..................................................... G11C 7/00
(52) U.S. Cl. ................ 365/189.07; 365/200; 365/230.08
(58) Field of Search .............................. 365/189.07, 201, 365/200, 230.03, 191, 230.08

(56) References Cited

U.S. PATENT DOCUMENTS

| 5,483,490 | * | 1/1996 | Iwai et al. ............................. | 365/200 |
| 5,631,868 | * | 5/1997 | Termullo, Jr. et al. ............... | 365/200 |
| 6,018,811 | * | 1/2000 | Merritt ................................. | 714/711 |
| 6,115,300 | * | 9/2000 | Massoumi et al. .................. | 365/200 |

FOREIGN PATENT DOCUMENTS 8-235892  9/1996 (JP) .

\* cited by examiner

Primary Examiner—David Nelms
Assistant Examiner—Thong Le
(74) Attorney, Agent, or Firm—Banner & Witcoff, Ltd.

(57) ABSTRACT

A semiconductor memory device capable of relieving a defect after assembly has a memory cell array; a plurality of redundant elements for relieving a defective memory cell of the memory element; decoders for decoding an address to select a memory cell of the memory cell array; first address comparator circuits capable of carrying out a programming in a wafer state, for outputting a substitute signal for selecting one of the plurality of redundant elements with respect to a defective address detected in the wafer state; and second address comparator circuits capable of carrying out a programming after assembly, for outputting a substitute signal for selecting another of the plurality of redundant elements with respect to a defective address detected after a chip is assembled.

30 Claims, 9 Drawing Sheets

| CONTROL SIGNAL | USUAL OPERATION | REDUNDANT ROW CELL ARRAY TEST DURING DS | REDUNDANT ROW CELL ARRAY TEST BEFORE PROGRAMMING IN ADDRESS COMPARATOR CIRCUIT 10b | | | CUPLICATE USE CHECKING TEST | |
|---|---|---|---|---|---|---|---|
| | | | "0" write | "1" write | "0" read | TEST1 | TEST2 |
| NRact | H or L | L | L | H or L | L | H | H |
| /SRact | H | L | L | H | L | H | H |
| SRtest | L | H | H | L | H | L | L |
| /MStest1 | H | Don't care | Don't care | H | Don't care | L | H |
| /MStest2 | H | Don't care | Don't care | H | Don't care | H | L |

FIG. 10

SEMICONDUCTOR MEMORY DEVICE

CROSS REFERENCE TO RELATED APPLICATIONS

The subject application is related to subject matter disclosed in Japanese Patent Application No. H11-210295 filed on Jul. 26, 1999 in Japan to which the subject application claims priority under Paris Convention and which is incorporated herein by reference.

BACKGROUND OF THE INVENTION

The present invention relates generally to a semiconductor memory device adopting a redundant circuit system for relieving defects in memory cells.

In semiconductor memories, such as DRAMs, defective cell rows and/or defective cell columns of a memory cell array are generally replaced with redundant cell rows and/or redundant cell columns to be relieved. Hereinafter, cell rows and cell columns are simply referred to as rows and columns, respectively.

In order to achieve this, a cell array including redundant rows and redundant columns, together with an address comparator circuit, is provided in a chip.

In the address comparator circuit, a defective address is programmed on the basis of test (die sorting test) results performed in a wafer state. Then, the address comparator circuit has the function of outputting a substitute signal when an inputted address is coincident with the programmed defective address, to select a redundant row or a redundant column in place of a defective row or a defective column. Hereinafter, a redundant row or a redundant column is referred as a redundant element if distinction is not necessary.

A typical defective address storing circuit of the address comparator circuit uses a fuse circuit wherein a programming is carried out by laser light. After the programming in the address comparator circuit, non-defective memory chips are cut away from a wafer to be assembled into packages. Thereafter, a stress test is carried out, and finally, a memory test (a shipping test) is carried out whether the memory is normally operated. Only non-defective memories having passed the memory test are shipped, and the rest of the memories are discarded.

Conventionally, a fuse element blown by laser light has been used as the address comparator circuit, and there has been no means for relieving defects found in a test after assembly.

Therefore, in order to improve the yields of memories, it is important to precisely carry out a wafer process to enhance the yields in a die sorting test and to reduce the number of chips discarded by a shipping test. However, conventional semiconductor memories are not provided with any means for relieving defects generated after assembly.

SUMMARY OF THE INVENTION

It is therefore an object of the present invention to eliminate the aforementioned problems and to provide a semiconductor memory device capable of relieving defects generated after assembly.

According to one aspect of the present invention, there is provided a semiconductor memory device comprising:
a memory cell array;
a plurality of redundant elements for relieving defective memory cells of said memory cell array;
a decode circuit for decoding an input address to select a memory cell of said memory cell array;
a first address comparator circuit capable of carrying out a programming using laser light in a wafer state, for outputting a substitute signal for selecting one of said plurality of redundant elements with respect to a defective address detected in the wafer state; and
a second address comparator circuit capable of electrically carrying out a programming after assembly, for outputting a substitute signal for selecting another of said plurality of redundant elements with respect to a defective address detected after a chip is assembled.

According to the present invention, a first address comparator circuit for carrying out a programming in a wafer state, together with a second address comparator circuit capable of carrying out a programming after assembly, is provided, so that it is possible to relieve defects, which are produced in a test after assembly, to enhance the relief efficiency for memories.

If a test circuit for detecting defects of a plurality of redundant elements is provided according to the present invention, it is possible to avoid a defective redundant element when a programming is carried out in the second address comparator circuit.

According to a second aspect of the present invention, there is provided a semiconductor memory device comprising:
a memory cell array which is divided into a plurality of cell array blocks;
first and second groups of redundant elements, each group of said redundant elements being arranged for each of said cell array blocks so as to relief a defective memory cell in a corresponding one of said cell array blocks;
a decode circuit for decoding an input address to select a memory cell of said memory cell array;
a first address comparator circuit capable of carrying out a programming using laser light in a wafer state, for outputting a substitute signal for selecting one of said plurality of redundant elements with respect to a defective address detected in the wafer state; and
a second address comparator circuit capable of electrically carrying out a programming after assembly, for outputting a substitute signal for selecting another of said plurality of redundant elements with respect to a defective address detected after a chip is assembled,
wherein said first address comparator circuit is shared by said plurality of cell array blocks to be capable of flexibly corresponding to said first group of redundant elements of each of said cell array blocks, and
said second address comparator circuit is shared by said plurality of cell array blocks to be capable of flexibly corresponding to said second group of redundant elements of each of said cell array blocks.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiments of the present invention will be described below.

Figure 1:
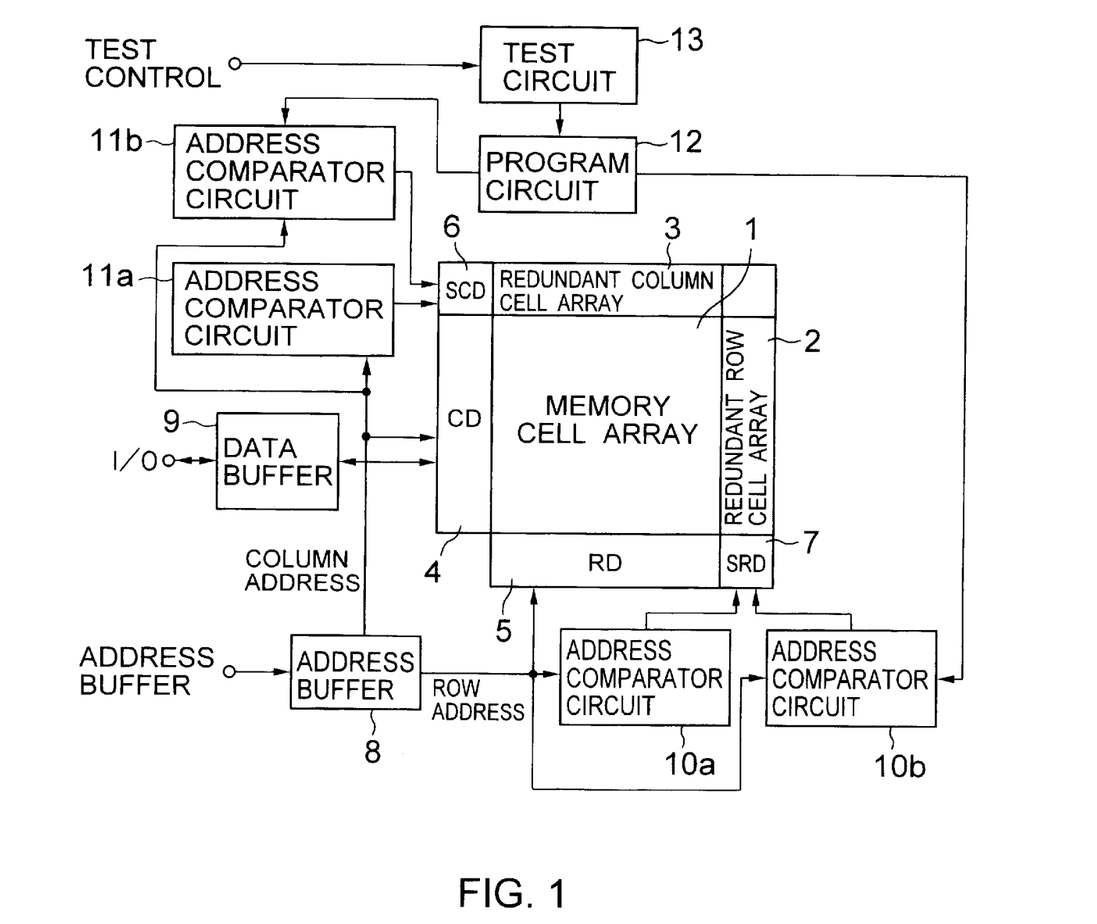
FIG. 1 is a block diagram of a preferred embodiment of a DRAM according to the present invention.
Figure 2:
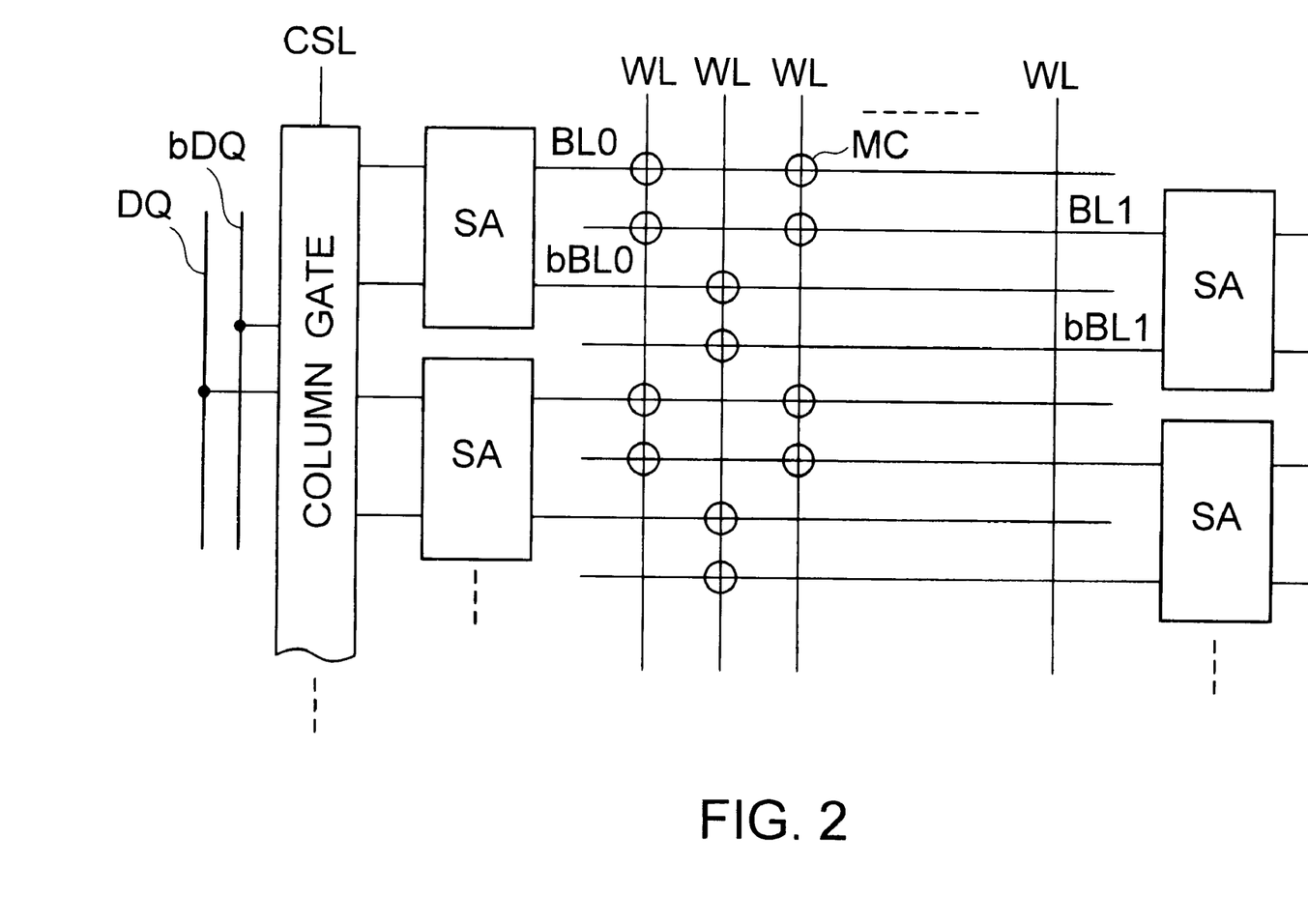
FIG. 2 is a block diagram of a memory cell array of the DRAM in this preferred embodiment.

FIG. 1 shows the construction of a DRAM according to the present invention. As shown in FIG. 2, a memory cell array 1 comprises a plurality of bit lines BL and bBL (b denotes "with bar", that is inverted logic), a plurality of word lines WL intersecting the bit lines, and dynamic memory cells MC arranged at the points of intersection, at which the word lines intersect the bit lines. The end portions of the bit lines BL and bBL are provided with bit line sense amplifiers SA. The bit lines BL and bBL are selected by a column gate, which is driven by a column selecting line CSL, to be connected to data lines DQ and bDQ.

As redundant circuits for relieving defects of the memory cell array 1, a redundant row cell array 2 and a redundant column cell array 3 are provided. The redundant row cell array 2 comprises a plurality of redundant rows, and each redundant row has spare word lines for replacing defective word lines.

The redundant column cell array 3 comprises a plurality of redundant columns, and each redundant column has a spare column selecting line for replacing a plurality of bit lines (specifically a column selecting line).

Row and column addresses incorporated into an address buffer 8 are decoded by a row decoder 5 and a column decoder 4, respectively. The word lines WL of the memory cell array 1 are selectively driven by the decoded output of the row decoder 5, and the bit lines BL and bBL of the memory cell array 1 are selected by the decoded output of the column decoder 4. A redundant row decoder 7 and a redundant column decoder 6 for selecting the redundant row cell array 2 and the redundant column cell array 3, respectively, are provided adjacent to the row decoder 5 and the column decoder 4, respectively.

As row address comparator circuits for storing a defective row address to replace a defective row by means of the redundant row and for detecting the coincidence with the inputted defective row address to output a substitute signal when the defective row address is inputted, a first row address comparator circuit 10a and a second row address comparator circuit 10b are provided.

Similarly, as column address comparator circuits for storing a defective column address to replace a defective column by means of the redundant column and for detecting the coincidence with the inputted defective column address to output a substitute signal when the defective column address is inputted, a first column address comparator circuit 11a and a second column address comparator circuit 11b are provided.

Each of the first row address comparator circuit 10a and the first column address comparator circuit 11a is provided for programming a defective address in a wafer state, the defective address having been detected by the test result in the wafer state, and comprises a fuse circuit using a fuse blown by laser light. Each of the second row address comparator circuit 10b and the second column address comparator circuit 11b is provided for programming a defective address, which has been detected by the test result after assembling the chip, and comprises a fuse circuit using a fuse disengaged or connected by electrically applying a high voltage thereto.

As described above, the second row address comparator circuit 10b and the second column address comparator circuit 11b are capable of electrically carrying out a programming after assembly, i.e., after the DRAM chip is sealed or molded in a package. Therefore, as shown in FIG. 1, a program circuit 12 is prepared for writing a defective address in the second row address comparator circuit 10b and second column address comparator circuit 11b. For example, this program circuit 12 is designed to carry out the electrical programming of the second row address comparator circuit 10b and second column address comparator circuit 11b on the basis of the test results of a test circuit 13 which is used for carrying out a shipping test after assembly.

Figure 3:
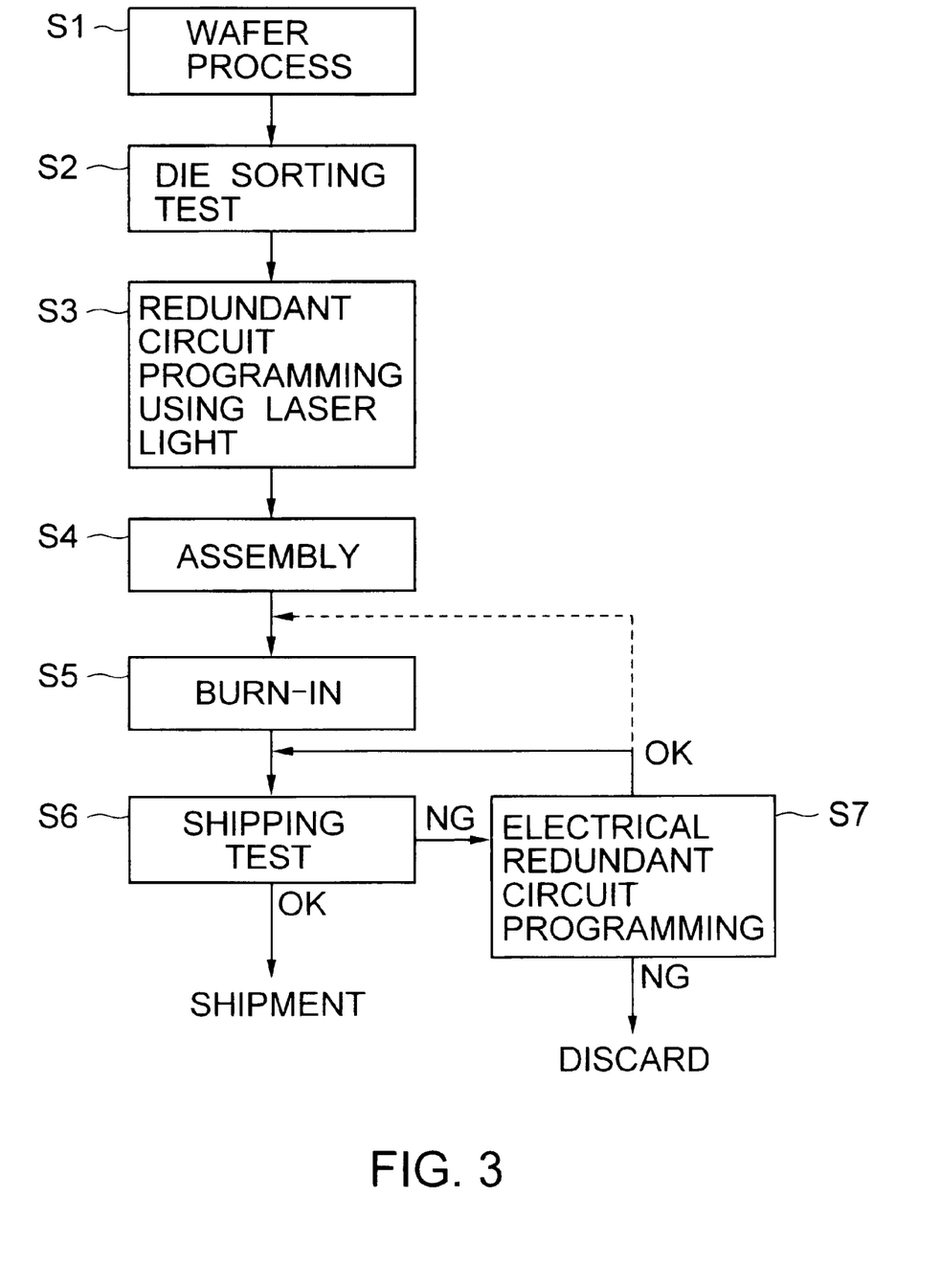
FIG. 3 is a flow chart showing a process for producing the DRAM in this preferred embodiment.

FIG. 3 shows the flow of the processing from a water process to shipping of the DRAM in this preferred embodiment. After a wafer process (S1) is completed, a die sorting test is carried out in a wafer state (S2).

With respect to defects detected by this die sorting test, a redundant circuit program, i.e., the program of the first address comparator circuits 10a and 11a shown in FIG. 1, is carried out similar to conventional cases (S3). Thereafter, the DRAM chip is divided to be assembled every chip (S4), and a burn-in processing is carried out (S5). Then, a shipping test is carried out (S6), and the chip is shipped if it passes the shipping test.

If the chip is rejected in the shipping test, an electrical redundant circuit program, i.e., the program of the second address comparator circuits 10b and 11b shown in FIG. 1, is carried out with respect to a newly detected defective address (S7). After the program is completed, the chip is returned to the shipping test (or the burn-in test as shown by the broken line), and final non-defective chips are shipped.

Conventionally, most of DRAM chips, which newly become defective in the shipping test after assembly, have a small number of defective bits. Therefore, the second address comparator circuits 10b and 11b for electrically carrying out a programming are effective even if the number of the second address comparator circuits is small, so that it is possible to relieve chips which have been conventionally discarded.

The basic construction and operation of the defect relief using two kinds of address comparator circuits have been described above. The concrete correspondence between address comparator circuits and redundant circuits will be described below. In actual DRAMs, a memory cell array is divided into a plurality of cell array blocks, and each cell array block is provided with redundant elements so as to relieve defects in each cell array block. A plurality of address comparator circuits are also provided so as to correspond thereto.

In this case, there are two kinds of correspondences between address comparator circuits and redundant elements.

Figure 4:
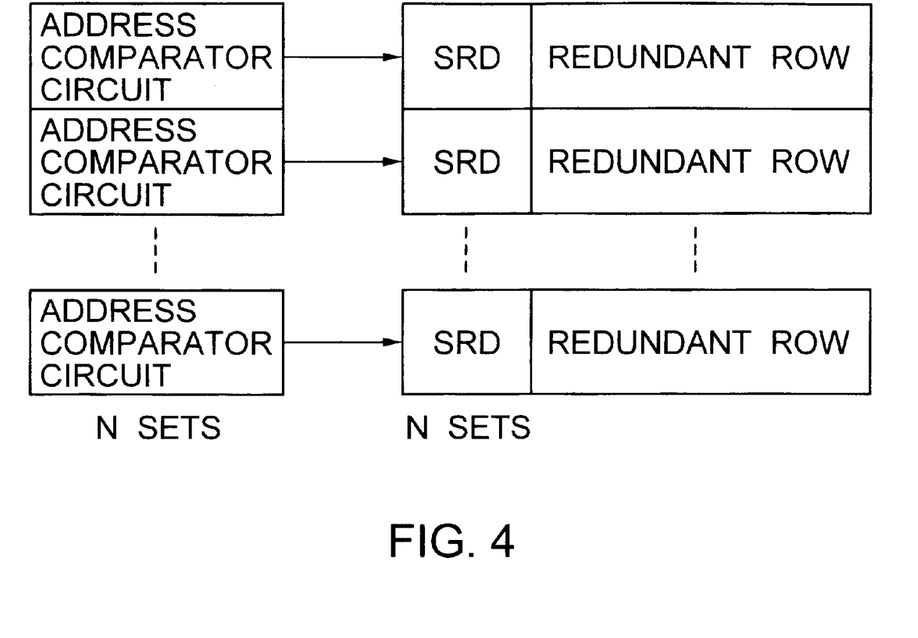
FIG. 4 is a schematic diagram showing an example of the correspondence between address comparator circuits and redundant rows in this preferred embodiment.
Figure 5:
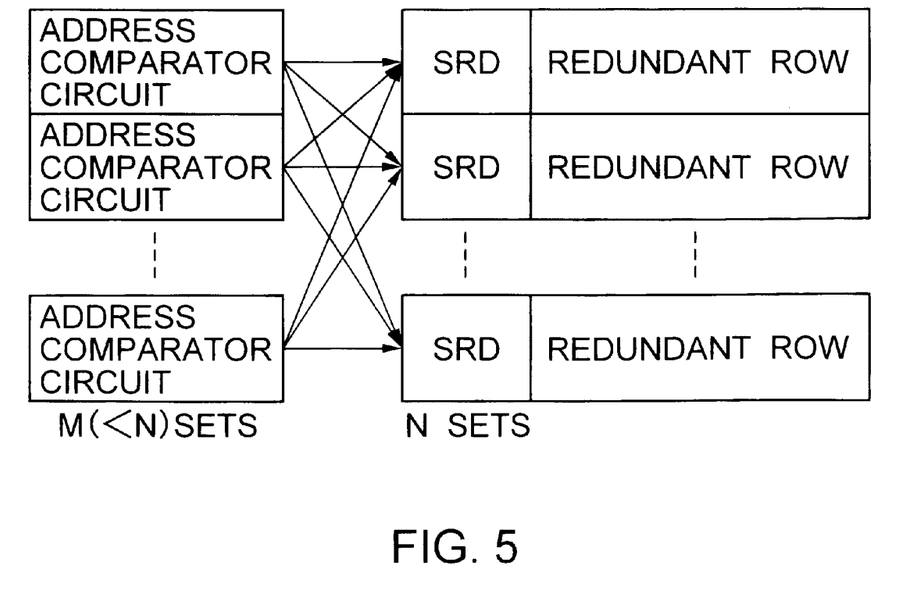
FIG. 5 is a schematic diagram showing another example of the correspondence between address comparator circuits and redundant rows in this preferred embodiment.

However, all of the following descriptions will be described only with respect to the row side since the descriptions with respect to the column side are the same. As shown in FIG. 4, one of the correspondences is the one-to-one correspondence between N sets of address comparator circuits and N sets of redundant rows (each usually comprising a couple of spare word lines). As shown in FIG. 5, the other correspondence is the flexible correspondence between M sets of address comparator circuits and N sets of redundant rows.

Usually, defects in chips are often biased for each chip. Therefore, all of redundant rows are never used. When the correspondence shown in FIG. 4 is used, if the number of redundant rows used on average is half, the number of used address comparator circuits is also half. Thus, the presence of address comparator circuits, which are not actually used, prevents the reduction of the area of the chip.

On the other hand, in the case of the flexible correspondence between address comparator circuits and redundant rows as shown in FIG. 5, the number M of address comparator circuits has only to be the number of actually used redundant rows, and can meet M<N. The number of actually required address comparator circuits can be previously determined by presuming the defect distribution and defect mode depending on the used process technique, so that the number M of address comparator circuits in the case of the correspondence of FIG. 5 can be determined. Therefore, the area of the chip can be reduced by adopting the correspondence of FIG. 5.

The correspondence of FIG. 5 is generally used when only address comparator circuits for carrying out a programming using laser light are used. However, according to the present invention, two kinds of address comparator circuits are used as described above, so that it is not simple to establish the flexible correspondence between these address comparator circuits and redundant rows. Because there is some possibility that the substitution using two kinds of address comparator circuits is carried out by the same redundant row, specifically that the same redundant row is selected by different addresses, unless the correspondence between redundant rows and two kinds of address comparator circuits is identified on any conditions.

Figure 6:
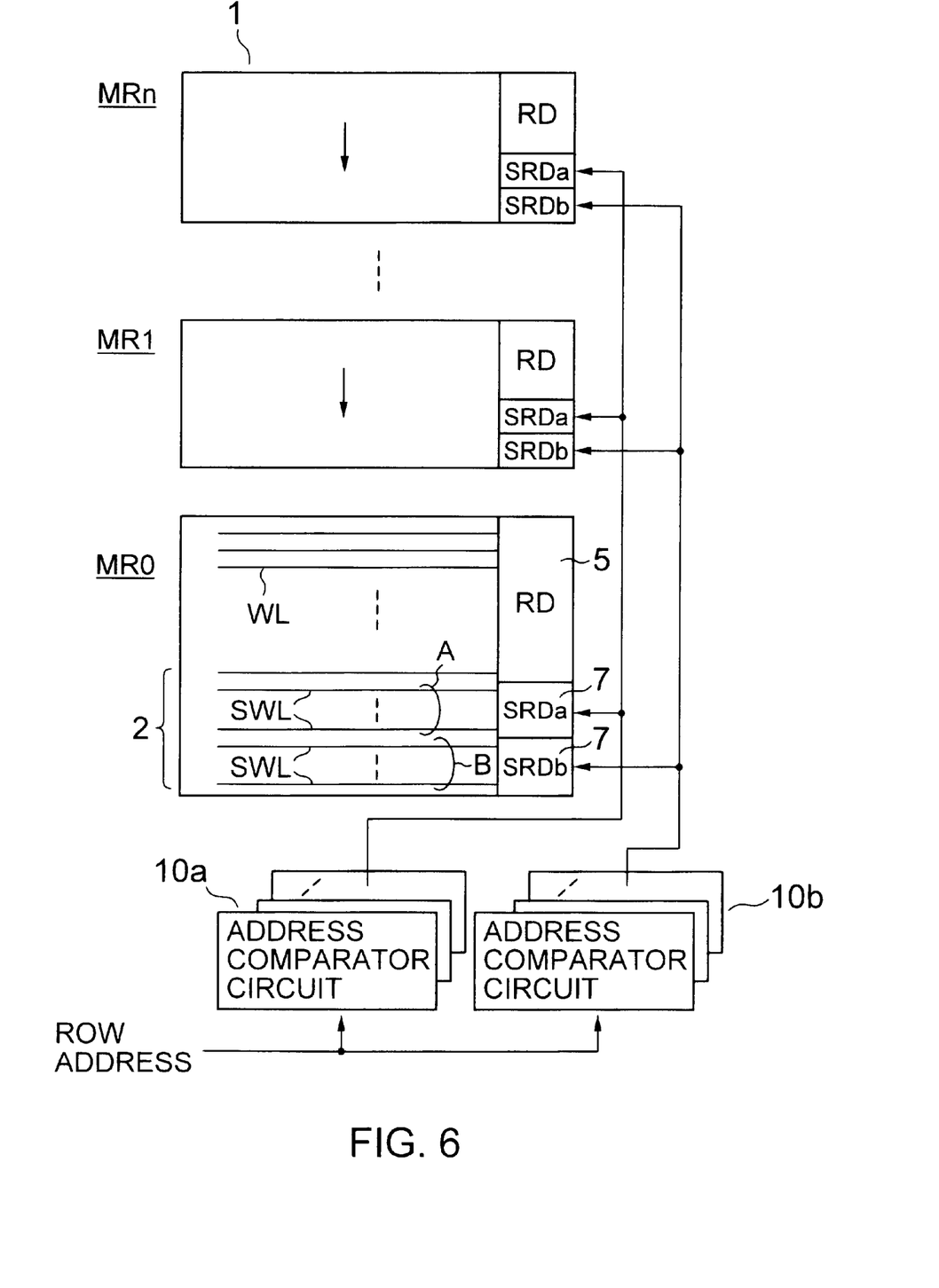
FIG. 6 is a block diagram showing a concrete preferred embodiment, to which the correspondence of FIG. 5 is applied.

FIG. 6 shows a preferred embodiment wherein the same redundant row is not substituted by means of two kinds of address comparator circuits. A memory cell array 1 divided into a plurality of cell array blocks MR0 through MRn, each of which is provided with a redundant row cell array 2. In this preferred embodiment, the redundant row cell array 2 is divided into two groups A and B every cell array block, and each of the groups includes a plurality of spare word lines SWL.

An address comparator circuit 10*a* for carrying out a programming using laser light is capable of flexibly coping with a redundant row decoder SRDa for selecting a redundant row of the group A of each cell array block. Similarly, an address comparator circuit 10*b* for electrically carrying out a programming after assembly is capable of flexibly coping with a redundant row decoder SRDb for selecting a redundant row of the group B of each cell array block.

According to this preferred embodiment, the redundant cell array 2 is physically divided into the group A, which is used during a die sorting, and the group B, which is used after assembly, at different addresses. The same redundant row is not selected by two address comparator circuits 10*a* and 10*b*. Specifically, in order to cause the two address comparator circuits 10*a* and 10*b* to correspond to only the redundant rows of the groups A and B, respectively, it has only to impose restrictions on a software for programming defective address or on the circuits themselves.

In the above described preferred embodiment shown in FIG. 6, the number of redundant rows belonging to the groups A and B is constant, so that there is a limit to the number of redundant rows usable during a die sorting. Therefore, if the number of defects exceeds the number of redundant rows of the group A during a die sorting, it is impossible to relieve the defects. Therefore, in an actual application, it is preferably possible to use all of redundant rows during the die sorting and to use the rest of redundant rows in the programming after assembly, without distinguishing the redundant circuit between the groups A and B.

Figure 7:
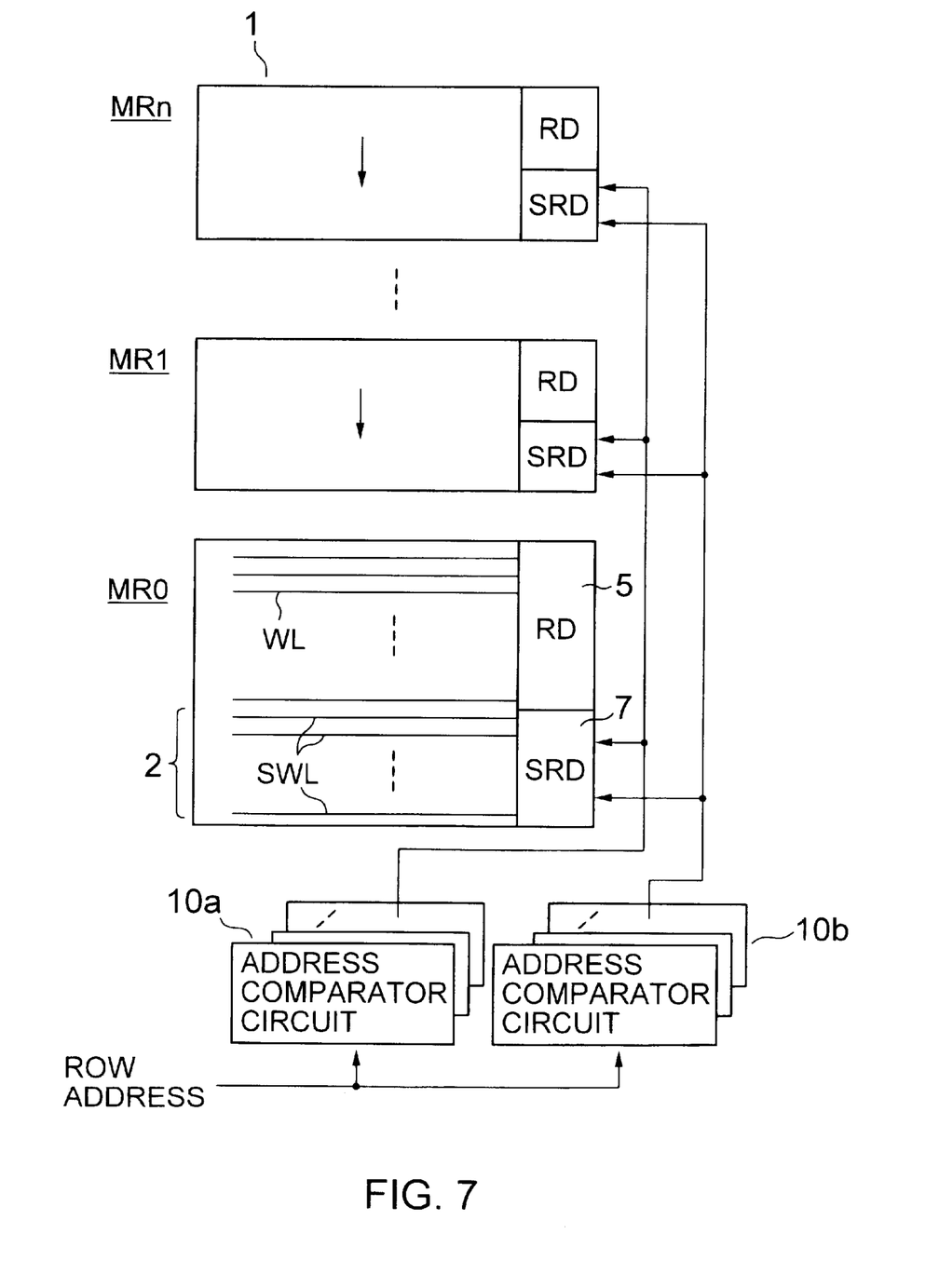
FIG. 7 is a block diagram showing another concrete preferred embodiment, to which the correspondence of FIG. 5 is applied.

FIG. 7 shows a preferred embodiment for allowing such a using method. That is, in this preferred embodiment unlike the preferred embodiment shown in FIG. 6, two address comparator circuits 10*a* and 10*b* can flexibly correspond to all of redundant row decoders SRD of each cell block. In other words, the correspondence between the redundant row decoders SRD and the two address comparator circuits 10*a* and 10*b* is not identified.

Therefore, the address comparator circuits 10*a* and 10*b* are shared by a plurality of cell array blocks. In actual use, the correspondence of the address comparator circuit 10*a* to a plurality of redundant rows of each cell array block is sequentially carried out from a specific address. In addition, the correspondence of the address comparator circuit 10*b* to the plurality of redundant rows of each cell array block in the opposite order to that of the address comparator circuit 10*a*.

More specifically, the address comparator circuit 10*a* during a die sorting uses a plurality of redundant rows of each cell array block in order of address. When a defect exists in a redundant row, its address is passed to use the next redundant row. Then, the address comparator circuit 10*b* after assembly uses a plurality of redundant rows of each cell array block in order of greater address.

If such a technique is used, when many defects are detected during a die sorting, it is possible to use all of redundant rows attached to each cell array block.

In relief during a shipping test, the redundant rows are used in order of greater address without examining which redundant row is not used. Therefore, there is some possibility of repeatedly using the redundant row, which has been already used in the die sorting, but its probability is small. Because defects are biased in each chip so that all of redundant rows are hardly consumed during the die sorting and because the number of defective bits is small during the shipping test.

Furthermore, if the above described duplicate use occurs although its probability is small, screening has only to be finally carried out in the shipping test.

By the way, when a defect exists in a spare word line, a defective word line does not become a non-defective word line even if the spare word line is substituted for the defective word line. Therefore, in order to enhance the defective relieving efficiency, the defects in spare word lines can be preferably tested.

Figure 8:
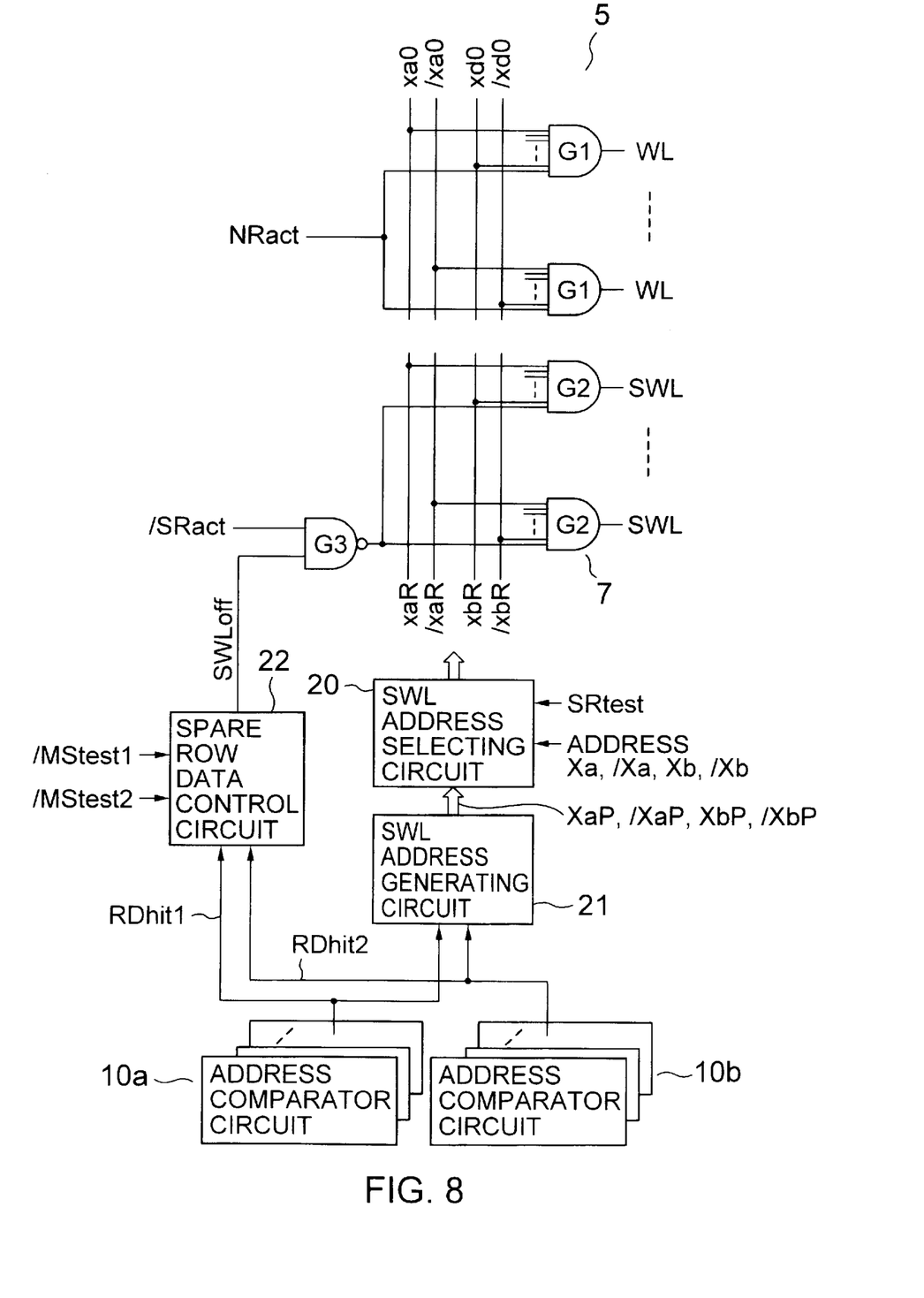
FIG. 8 is a block diagram of a test circuit of redundant rows.

FIG. 8 shows the construction of a test circuit of a DRAM, which can test defects in spare word lines. By combining various control signals, various test can be carried out. Internal row address signals xa0, /xa0, ..., xd0 and /xd0 are connected to a decode gate G1 of a row decoder 5 for selecting word lines WL, and a word line activating signal NRact is inputted to the decoder gate G1. Address signals xaR, /xaR, xbR and /xbR for spare word lines, and the output of a gate G3 are inputted to a decode gate G2 for selecting spare word lines SWL.

With respect to the address signals for spare word lines, usual row addresses xa, /xa, xb and /xb, or address signals xaP, /xaP, xbP and /xbP, which are generated by a spare word line address generating circuit 21 when a row address is coincident with a defective address previously programmed in a comparator, are selectively supplied by means of a spare word line address selecting circuit 20 in accordance with an address switching signal SRtest for a spare word line. To the gate G3, a spare word line activating signal /SRact and an output signal SWLoff of a spare row decoder control circuit 22 are inputted. The spare row decoder control circuit 22 outputs the output signal SWLoff in accordance with the coincidence of a row address with a defective address previously programmed in the address comparator circuit 10a or 10b and in accordance with two kinds of test signals /MRtest1 and /MRtest2.

Figure 9:
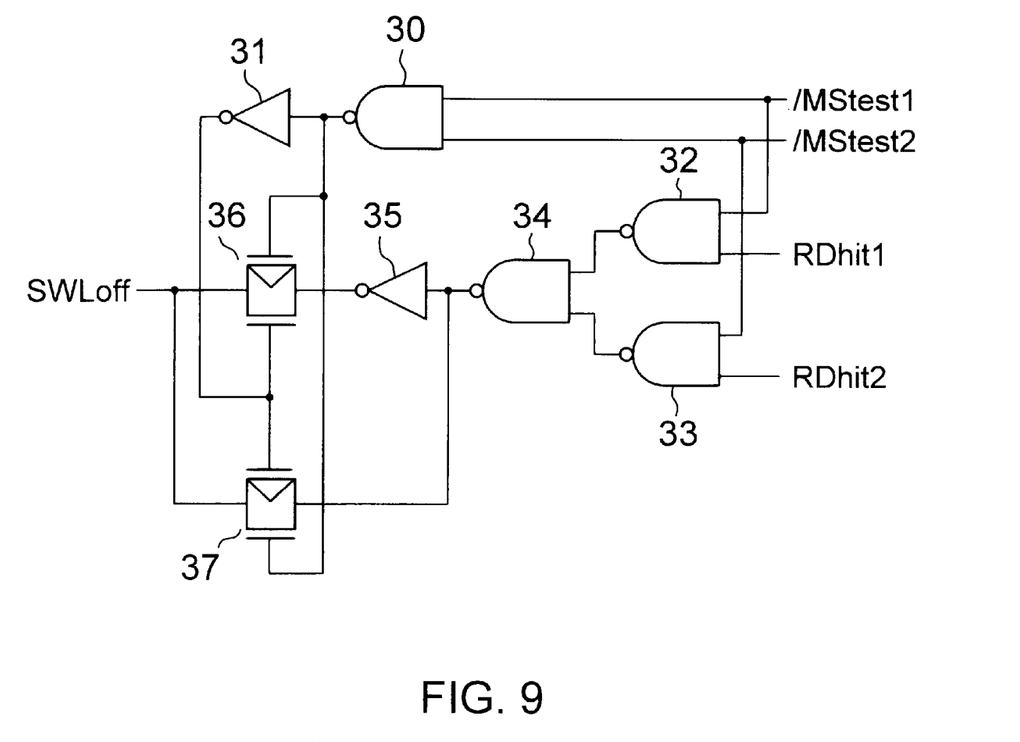
FIG. 9 is a circuit diagram of a spare row decoder control circuit of FIG. 8.

FIG. 9 shows a concrete circuit construction of the spare row decoder control circuit 22. In this circuit, when both of the test signals /MRtest1 and /MRtest2 are in "H", the output of a NAND gate 30 is in "L", so that a CMOS transfer gate 36 is turned ON, and when any one of hit signals RDhit1 and RDhit2 is in "H", an output signal SWLoff="L" is outputted. When any one of the test signals /MRtest1 and /MRtest2 is in "L", a transfer gate 37 is turned ON.

Figure 10:
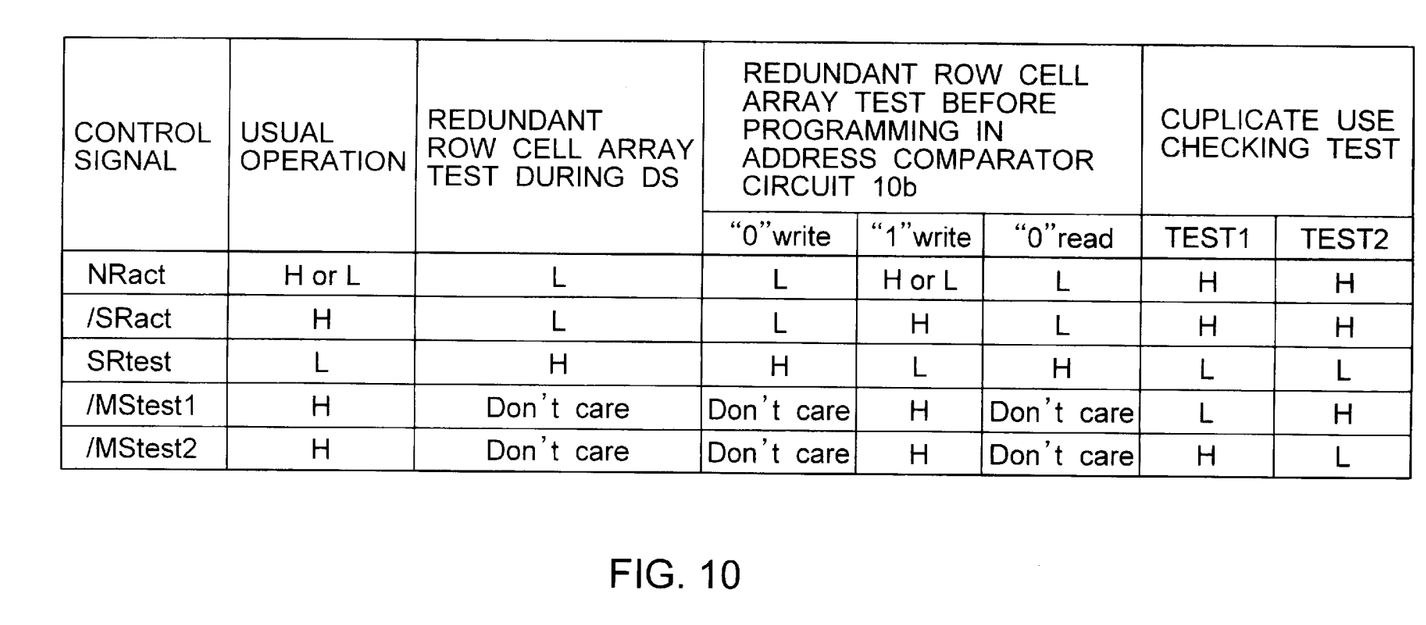
FIG. 10 is a table showing combinations of control signals during various operations.

FIG. 10 shows combinations of control signals corresponding to various operation modes. In a usual operation, in which a user usually carries out a memory access, control signals other than SRtest and NRact are in "H". Therefore, only when a row address is coincident with a defective address which has been previously programmed in the comparator circuits 10a and 10b (i.e., when any one of hit signals RDhit1 and RDhit2 is in "H"), SWLoff and NRact are set to be in "L", and a spare word line SWL is activated in accordance with an address outputted from the spare word line address generating circuit 21, so that a defective word line is not activated.

When a redundant cell array is tested during a die sorting, a control signal NRact is set to be in "L" to prevent a word line WL from being activated, and /SRact and SRtest are set to be in "L" and "H", respectively, to activate a spare word line SWL in accordance with a lower address supplied to the row decoder. By this method, it is possible to identify the defective spare word line included in the redundant row cell array part. Thus, it is possible to prevent the defective spare word line from being used when the address comparator circuit 10a is programmed by laser light.

When a defect occurs in a test after assembly, the defect is relieved by means of the address comparator circuit 10b. It has been described above that the spare word lines are sequentially used in order of greater address without examining the used state of the spare word lines. In this case, although the probability of repeatedly using the same spare word line in the address comparator circuits 10a and 10b is small, it is preferably possible to simply check whether the duplicate use occurs before relief. Moreover, if only unused word lines can be tested, it is possible to relieve a defective word line while avoiding the use of the defective spare word line.

This test is performed as a combination of the redundancy row cell array test and a usual operation. First, signals NRact and /SRact are both set to "L" and the signal SRtest is set to "H", then "0" data are written in the whole redundancy row cell array. Next, "1" data are written in the whole redundancy cell array through the usual operation. If a spare word line has already been used and been in correspondence with the address comparator circuit 10a, since the spare word line is activated at the address programmed by the address comparator circuit, "1" data is written in the selected cell.

After that, the test mode becomes to the redundancy row array test mode. In this mode, by performing reading for an expected value "0", the spare word line having correspondence with the address comparator circuit 10a and cells inherently having defects are detected as defective.

Therefore, when a defective address is programmed in the address comparator circuit 10b, it is possible to avoid spare word lines, which have been already used, and spare word lines which contain defects although they have not been used.

As described above, in an actual application, there are some cases where only a test after substitution is carried out without examining the used state of the spare word lines in relation to test costs. The circuit construction of FIG. 8 can carry out a test for checking the duplicate use of the spare word lines. In that case, a test 1' for setting /MRtest1 in "L" from a usual operation to prevent the activation of the spare word line programmed in the address comparator circuit 10b, and a test 2 for setting /MRtest2 in "L" from the usual operation to prevent the activation of the spare word line programmed in the address comparator circuit 10a are separately carried out. In these tests, a defect occurs in the address of the defective word line before relief. Therefore, the defective address in test 1 is compared with the defective address in test 2, so that it can be determined that the same spare word line is used if these address are coincident with each other. Thus, it is possible to carry out the screening of the duplicate use of the spare word line.

As described above, according to the present invention, the first address comparator circuit for carrying out the programming in the wafer state, together with the second address comparator circuit capable of carrying out the programming after assembly, is provided, so that it is possible to relief defects, which occur in a test after assembly, to enhance the memory relieving efficiency.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A semiconductor memory device comprising:

a memory cell array;

a plurality of redundant elements for relieving defective memory cells of said memory cell array;

a decode circuit for decoding an input address to select a memory cell of said memory cell array;

a first address comparator circuit capable of carrying out a programming using laser light in a wafer state, for outputting a substitute signal for selecting one of said plurality of redundant elements with respect to a defective address detected in the wafer state; and a second address comparator circuit capable of electrically carrying out a programming after assembly, for outputting a substitute signal for selecting another of said plurality of redundant elements with respect to a defective address detected after a chip is assembled.

2. The semiconductor memory device as set forth in claim 1, wherein said memory cell array is divided into a plurality of cell array blocks, a plurality of redundant cell arrays comprise a plurality of sets of redundant elements, each set of redundant cell arrays being arranged for each of said cell array blocks, and said first and second address comparator circuits are capable of flexibly corresponding to said plurality of redundant elements of each of said cell array blocks.

3. The semiconductor memory device as set forth in claim 2, wherein said first address comparator circuit is shared by said plurality of cell array blocks to correspond to said plurality of redundant elements of each of said cell array blocks, and said second address comparator circuit is shared by said plurality of cell array blocks to correspond to said plurality of redundant elements of each of said cell array blocks so as not to overlap said first address comparator circuit.

4. The semiconductor memory device as set forth in claim 3, wherein said first address comparator circuit is sequentially caused to correspond to said plurality of redundant elements of each of said cell array blocks from one of said plurality of redundant elements having a specific address, and said second address comparator circuit is caused to correspond to said plurality of redundant elements of each of said cell array blocks in the opposite order to that with respect to said first address comparator circuit.

5. The semiconductor memory device as set forth in claim 4, wherein said specific address is a logical address.

6. The semiconductor memory device as set forth in claim 4, wherein said specific address is a physical address.

7. The semiconductor memory device as set forth in claim 1, which further comprises a test circuit for detecting a defect in said plurality of redundant elements.

8. The semiconductor memory device as set forth in claim 7, wherein said test circuit has the function of selecting one of said plurality of redundant elements, which does not correspond to said first address comparator circuit, to detect a defect in said one of said plurality of redundant elements.

9. The semiconductor memory device as set forth in claim 7, wherein said test circuit has the function of detecting that the redundant element corresponds to both said first address comparator circuit and said second address comparator circuit.

10. A semiconductor memory device comprising:
a memory cell array which is divided into a plurality of cell array blocks;
first and second groups of redundant elements, each group of said redundant elements being arranged for each of said cell array blocks so as to relieve a defective memory cell in a corresponding one of said cell array blocks;
a decode circuit for decoding an input address to select a memory cell of said memory cell array;
a first address comparator circuit capable of carrying out a programming in a wafer state, for outputting a substitute signal for selecting one of said plurality of redundant elements with respect to a defective address detected in the wafer state; and
a second address comparator circuit capable of electrically carrying out a programming after assembly, for outputting a substitute signal for selecting another of said plurality of redundant elements with respect to a defective address detected after a chip is assembled, wherein said first address comparator circuit is shared by said plurality of cell array blocks to be capable of flexibly corresponding to said first group of redundant elements of each of said cell array blocks, and said second address comparator circuit is shared by said plurality of cell array blocks to be capable of flexibly corresponding to said second group of redundant elements of each of said cell array blocks.

11. The semiconductor memory device as set forth in claim 10, wherein the ratio of said first group of redundant elements and said second group of redundant elements is capable of being assigned by a software.

12. The semiconductor memory device as set forth in claim 10, wherein said first address comparator circuit comprises a fuse circuit which is programmed by laser light, and said second address comparator circuit comprises a fuse circuit which is electrically programmed.

13. The semiconductor memory device as set forth in claim 10, which further comprises a test circuit for detecting a defect in said plurality of redundant elements.

14. The semiconductor memory device as set forth in claim 13, wherein said test circuit has the function of selecting one of said redundant elements, which does not correspond to said first address comparator circuit, to detect a defect in said one of said redundant elements.

15. The semiconductor memory device as set forth in claim 13, wherein said test circuit has the function of detecting that the redundant element corresponds to both said first address comparator circuit and said second address comparator circuit.

16. A semiconductor memory device comprising:
a memory cell array;
a plurality of redundant elements for relieving defective memory cells of said memory cell array;
a decode circuit for decoding an input address to select a memory cell of said memory cell array;
a first address comparator circuit having a first set of programmable fuses for storing a first defective address detected in a wafer state using programming laser light, said first address comparator outputting a substituting signal for selecting one of said plurality of redundant elements with respect to the first a defective address; and
a second address comparator circuit having a second set of programmable fuses for electrically storing a second defective address detected after assembling a chip, said second address comparator outputting a substituting signal for selecting another one of said plurality of redundant elements with respect to the second defective address.

17. The semiconductor memory device as set forth in claim 16, wherein said memory cell array is divided into a plurality of cell array blocks, a plurality of redundant cell arrays comprise a plurality of sets of redundant elements, each set of redundant cell arrays being arranged for each of said cell array blocks, and said first and second address comparator circuits are capable of flexibly corresponding to said plurality of redundant elements of each of said cell array blocks.

18. The semiconductor memory device as set forth in claim 17, wherein
said first address comparator circuit is shared by said plurality of cell array blocks to correspond to said plurality of redundant elements of each of said cell array blocks, and
said second address comparator circuit is shared by said plurality of cell array blocks to correspond to said plurality of redundant elements of each of said cell array blocks so as not to overlap said first address comparator circuit.

19. The semiconductor memory device as set forth in claim 18, wherein
said first address comparator circuit is sequentially caused to correspond to said plurality of redundant elements of each of said cell array blocks from one of said plurality of redundant elements having a specific address, and
said second address comparator circuit is caused to correspond to said plurality of redundant elements of each of said cell array blocks in the opposite order to that with respect to said first address comparator circuit.

20. The semiconductor memory device as set forth in claim 19, wherein said specific address is a logical address.

21. The semiconductor memory device as set forth in claim 19, wherein said specific address is a physical address.

22. The semiconductor memory device as set forth in claim 16, which further comprises a test circuit for detecting a defect in said plurality of redundant elements.

23. The semiconductor memory device as set forth in claim 22, wherein said test circuit has the function of selecting one of said plurality of redundant elements, which does not correspond to said first address comparator circuit, to detect a defect in said one of said plurality of redundant elements.

24. The semiconductor memory device as set forth in claim 22, wherein said test circuit has the function of detecting that the redundant element corresponds to both said first address comparator circuit and said second address comparator circuit.

25. A semiconductor memory device comprising:
a memory cell array which is divided into a plurality of cell array blocks;
first and second groups of redundant elements, each group of said redundant elements being arranged for each of said cell array blocks so as to relieve a defective memory cell in a corresponding one of said cell array blocks;
a decode circuit for decoding an input address to select a memory cell of said memory cell array;
a first address comparator circuit having a first set of programmable fuses for storing a first defective address detected in a wafer state using programming laser light, said first address comparator outputting a substituting signal for selecting one of said plurality of redundant elements with respect to the first defective address; and
a second address comparator circuit having a second set of programmable fuses for electrically storing a second defective address detected after assembling a chip, said second address comparator outputting a substituting signal for selecting another one of said plurality of redundant elements with respect to the second defective address, wherein
said first address comparator circuit is shared by said plurality of cell array blocks to be capable of flexibly corresponding to said first group of redundant elements of each of said cell array blocks, and
said second address comparator circuit is shared by said plurality of cell array blocks to be capable of flexibly corresponding to said second group of redundant elements of each of said cell array blocks.

26. The semiconductor memory device as set forth in claim 25, wherein the ratio of said first group of redundant elements and said second group of redundant elements is assignable by software.

27. The semiconductor memory device as set forth in claim 25, wherein
said first address comparator circuit comprises a fuse circuit which is programmed by laser light, and
said second address comparator circuit comprises a fuse circuit which is electrically programmed.

28. The semiconductor memory device as set forth in claim 25, which further comprises a test circuit for detecting a defect in said plurality of redundant elements.

29. The semiconductor memory device as set forth in claim 28, wherein said test circuit has the function of selecting one of said redundant elements, which does not correspond to said first address comparator circuit, to detect a defect in said one of said redundant elements.

30. The semiconductor memory device as set forth in claim 28, wherein said test circuit has the function of detecting that the redundant element corresponds to both said first address comparator circuit and said second address comparator circuit.

* * * * *